United States Patent
Klee

(10) Patent No.: US 12,066,494 B2
(45) Date of Patent: Aug. 20, 2024

(54) METHOD FOR IDENTIFYING A MEASURE THAT IS NOT PROVIDED FOR BY THE MANUFACTURER ON OR USING A REMOVABLE BATTERY PACK AND REMOVABLE BATTERY PACK FOR CARRYING OUT THE METHOD

(71) Applicant: Robert Bosch GmbH, Stuttgart (DE)

(72) Inventor: Christoph Klee, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 237 days.

(21) Appl. No.: 17/378,927

(22) Filed: Jul. 19, 2021

(65) Prior Publication Data

US 2022/0026495 A1   Jan. 27, 2022

(30) Foreign Application Priority Data

Jul. 24, 2020   (DE) .................... 10 2020 209 401.2

(51) Int. Cl.
| | |
|---|---|
| *G01R 31/3835* | (2019.01) |
| *G01R 31/367* | (2019.01) |
| *G01R 31/374* | (2019.01) |
| *H02J 7/00* | (2006.01) |

(52) U.S. Cl.
CPC ....... *G01R 31/3835* (2019.01); *G01R 31/367* (2019.01); *G01R 31/374* (2019.01); *H02J 7/0044* (2013.01)

(58) Field of Classification Search
None
See application file for complete search history.

(56) References Cited

U.S. PATENT DOCUMENTS

| | | | | |
|---|---|---|---|---|
| 2004/0135696 A1* | 7/2004 | Hasegawa | ........ | G01R 31/3835 320/136 |
| 2007/0229026 A1* | 10/2007 | Morioka | .......... | H02J 7/0031 320/112 |
| 2009/0125979 A1* | 5/2009 | Shimada | ............ | G06F 21/40 429/61 |
| 2013/0069658 A1* | 3/2013 | Rich | .............. | G01R 31/392 324/426 |

(Continued)

FOREIGN PATENT DOCUMENTS

| | | |
|---|---|---|
| DE | 10 2016 209 822 A1 | 12/2017 |
| WO | 2020/043386 A1 | 3/2020 |

*Primary Examiner* — Brent A. Fairbanks
(74) *Attorney, Agent, or Firm* — Maginot, Moore & Beck LLP

(57) ABSTRACT

A method identifies a measure that is not provided for by a manufacturer on or using a removable battery pack having at least one energy storage cell and a monitoring unit. The method includes detecting and storing a voltage of the removable battery pack and/or a cell voltage of the at least one energy storage cell using the monitoring unit before the monitoring unit is set to a quiescent state or when the removable battery pack is set to a state other than a charging operating state. The method also includes comparing the detected voltage of the removable battery pack and/or the detected cell voltage with a previously-stored voltage of the removable battery pack or a previously-stored cell voltage using the monitoring unit when the monitoring unit is set to an operating state or when the removable battery pack is in the state other than the charging operating state.

14 Claims, 2 Drawing Sheets

(56) References Cited

U.S. PATENT DOCUMENTS

| | | | |
|---|---|---|---|
| 2013/0069661 A1* | 3/2013 | Rich | H01M 10/42 |
| | | | 324/433 |
| 2016/0141894 A1* | 5/2016 | Beaston | H02J 7/0014 |
| | | | 320/103 |
| 2017/0345101 A1* | 11/2017 | Beaston | H02J 7/0048 |
| 2018/0009330 A1* | 1/2018 | Ricci | G06V 40/1365 |

* cited by examiner

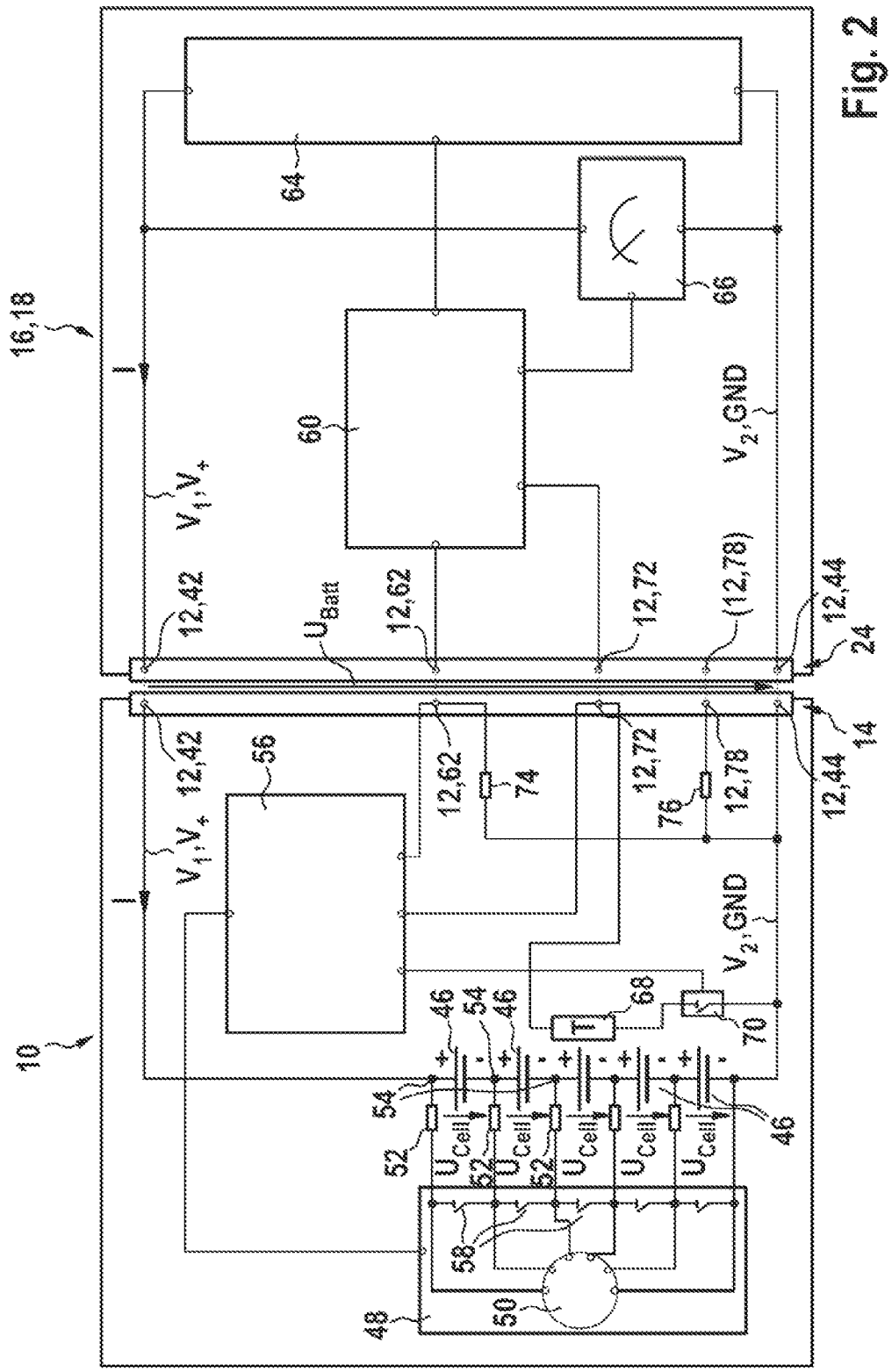

METHOD FOR IDENTIFYING A MEASURE THAT IS NOT PROVIDED FOR BY THE MANUFACTURER ON OR USING A REMOVABLE BATTERY PACK AND REMOVABLE BATTERY PACK FOR CARRYING OUT THE METHOD

This application claims priority under 35 U.S.C. § 119 to patent application no. DE 10 2020 209 401.2, filed on Jul. 24, 2020 in Germany, the disclosure of which is incorporated herein by reference in its entirety.

The disclosure relates to a method for identifying a measure that is not provided for by the manufacturer on or using a removable battery pack having at least one energy storage cell and having a monitoring unit. The disclosure further relates to a removable battery pack for carrying out the method.

BACKGROUND

A multiplicity of electrical consumers are operated using battery packs that can be removed without tools by the operator—referred to as removable battery packs in the following text—and that are discharged accordingly by the electrical consumer and can be recharged again by means of a charging device. Such removable battery packs usually consist of a plurality of energy storage cells interconnected in series and/or in parallel for achieving a requested removable battery pack voltage or capacity. If the energy storage cells are designed as lithium-ion cells (Li-ion), for example, a high power and energy density can particularly advantageously be achieved. On the other hand, to prevent electrical fault states, such cells also require compliance with strict specifications regarding the maximum charging and discharge current, the voltage and the temperature.

In modern removable battery packs, the cell voltage of the parallel-connected energy storage cells of what is known as a cell cluster is evaluated, for example, by a monitoring unit integrated in the removable battery pack. The term "cell voltage" should accordingly be understood not only as the voltage of an individual energy storage cell but also that of a cell cluster consisting of parallel-interconnected energy storage cells. So-called single cell monitoring (SCM) of this type is known, for example, from WO 20043386 A1, in which dangerous operation of the removable battery pack in the event of a fault is precluded by redundant monitoring.

In order for a charging device or an electrical consumer to know with which charging or discharge current a removable battery pack may be operated at a maximum, this is generally communicated by electrical coding, for example by coding resistors integrated in the removable battery pack that are measured by the electrical device and compared with a stored table, mechanical coding or a communication interface. DE 10 2016 209 822 A1 likewise discloses that the electrical device communicates to the removable battery pack that it may not continue to be used. The cell voltages can also be transmitted to the device via such an interface.

Proceeding from the prior art, it is the object of the disclosure to identify a measure that is misused or not provided for by the manufacturer on or using a removable battery pack and to react accordingly.

SUMMARY

According to the disclosure, provision is made for a voltage of the removable battery pack and/or a cell voltage of the at least one energy storage cell to be detected and stored by the monitoring unit before the monitoring unit is set to a quiescent state or while the removable battery pack is in a state other than a charging operating state, and for the voltage and/or the cell voltage to be detected and compared with the previously stored voltage or cell voltage by the monitoring unit when the monitoring unit is set to an operating state or while the removable battery pack is in a state other than a charging operating state. It is thus particularly advantageously possible that a removable battery pack can identify, substantially independently of other electrical devices of the manufacturer's system, whether a measure that is not provided for by the manufacturer has been carried out on or using same. A measure that is not provided for by the manufacturer is intended to be understood, for example, as charging using a charging device that has not been provided for or enabled by the manufacturer of the removable battery pack for the charging process (for example a non-authorized competitor product) and accordingly is considered as extraneous to the system. A further measure of this type is constituted by manipulation to the removable battery pack by exchanging individual or several defective or weak energy storage cells.

Operating states other than the charging operating state can be understood, in particular, as a discharging operating state, an operating state in which only the current state of charge of the removable battery pack and/or identified fault states are displayed, or a cyclical alert state for checking the removable battery pack and/or for activating a communication interface of the removable battery pack.

The voltage of a removable battery pack is generally a multiple of the voltage of an individual energy storage cell and results from the interconnection (in parallel or in series) of the individual energy storage cells. An energy storage cell is typically designed as a galvanic cell, which has a structure in which one cell pole comes to lie at one end and a further cell pole comes to lie at an opposite end. In particular, the energy storage cell at one end has a positive cell pole and at an opposite end a negative cell pole. The energy storage cells are preferably designed as lithium-based energy storage cells, for example Li-ion, Li—Po, Li-metal and the like. However, the disclosure can also be applied to removable battery packs with Ni—Cd, Ni-MH cells or other suitable cell types. In current Li-ion energy storage cells with a cell voltage of 3.6 V, for example voltage classes of 3.6 V, 7.2 V, 10.8 V, 14.4 V, 18 V, 36 V etc. are produced. An energy storage cell is preferably designed as an at least substantially cylindrical round cell, wherein the cell poles are arranged at ends of the cylinder shape. However, the disclosure is not dependent on the type and construction of the energy storage cells used but can be applied to any removable battery packs and energy storage cells, for example also pouch cells or the like in addition to round cells.

In another configuration of the disclosure, provision is made for the voltage and/or the cell voltage to be stored in a non-volatile manner when the monitoring unit is set to a quiescent state and to be able to be stored in a non-volatile or volatile manner when the monitoring unit is set to an operating state or when the removable battery pack is in a state other than a charging operating state. The non-volatile storage advantageously permits the removable battery pack 10 to be able to perform monitoring even after relatively long quiescent or storage pauses or after a deep discharge. An extra buffer-storage battery for the memory is thus not necessary. A non-volatile memory is intended to be understood as a memory that permanently retains its data even without an applied supply voltage, while this is generally not the case with a volatile memory. Examples of non-volatile memories are EEPROM (electrically erasable programmable read-only memory), FRAM (ferroelectric random-access memory), MRAM (magnetoresistive random-access memory) or phase-change RAM. Known volatile memories are, in particular, DRAM (dynamic random-access memory) or SRAM (static random-access memory). However, this list is purely exemplary and is not to be understood as restrictive.

A measure that is not provided for by the manufacturer is identified when the detected voltage and/or cell voltage is greater than the previously stored voltage or cell voltage by more than a permissible difference value, in particular by more than 500 mV. The difference value can advantageously be adapted to the energy storage cells used by the manufacturer of the removable battery pack. It is likewise conceivable that a temperature of the removable battery pack and/or the at least one energy storage cell is detected by the monitoring unit at the time of the voltage detection, and that the permissible difference value is adapted to the detected temperature by the monitoring unit. In this way, temperature fluctuations, for example caused by different storage and/or application locations or conditions, which influence the cell voltage, can advantageously be taken into account.

The monitoring unit blocks the removable battery pack for future intended charging and/or discharging processes or restricts the use thereof accordingly when a measure that is not provided for by the manufacturer has been identified. For this purpose, the monitoring unit deactivates a temperature sensor for measuring the temperature of the removable battery pack and/or the at least one energy storage cell by means of a switching element integrated in the removable battery pack. This can be identified by a charging device or by an electrical consumer of the system, such that these do not permit a charging or discharging process themselves.

In the context of the disclosure, electrical consumers should be understood to mean, for example, power tools operated using a removable battery pack for performing work on workpieces by means of an electrically driven insert tool. The power tool may in this case be realized both as a hand-held power tool and as a floor-standing power tool. Typical power tools in this context are hand-held or floor-standing drills, screwdrivers, impact drills, hammer drills, planers, angle grinders, orbital sanders, polishing machines, circular, bench, miter and jig saws or the like. However, gardening appliances operated using a removable battery pack such as lawn mowers, lawn trimmers, pruning saws or the like and also domestic appliances operated using a removable battery pack such as vacuum cleaners, mixers, etc., may also be included under the term electrical consumer. The disclosure can likewise be applied to electrical consumers that are supplied with power using a plurality of removable battery packs at the same time.

As an alternative or in addition, provision can be made for the blocking or restriction of a discharging process in connection with an electrical consumer to be canceled by the monitoring unit of the removable battery pack after a charging process provided for by the manufacturer has been carried out using a charging device. An operator of the system can in this way discover that a charging process that is not provided for by the manufacturer in the removable battery pack has been registered using the rechargeable battery pack. The blocking or restriction of the removable battery pack can furthermore be displayed on the removable battery pack in an optical, acoustic and/or haptic manner. In this case, the display can be designed in the form of LEDs by means of different colors and/or light sequences, a display screen and/or an acoustic signal generator. In addition or as an alternative, a haptic signal generator, for example in the form of a vibration motor, is also conceivable.

In another configuration of the disclosure, provision is made for the identified measures not provided for by the manufacturer to be stored and/or transmitted to an external device by the monitoring unit of the removable battery pack. In this connection, an external device should be understood as meaning, in particular, a smartphone, a tablet, a PC, a cloud or the like on which corresponding programs or apps for displaying, storing and/or evaluating the transmitted measures not provided for by the manufacturer are executed. The transmission can be effected via a communication interface, which operates wirelessly (for example Bluetooth, WLAN, NFC, Zigbee, LoRa, GSM, UMTS or the like) or else in a wired manner (for example USB, Lightning, RS232 or the like).

The disclosure also relates to a removable battery pack having at least one energy storage cell and having a monitoring unit for carrying out the method according to the disclosure.

BRIEF DESCRIPTION OF THE DRAWINGS

The disclosure is explained by way of example in the following text based on FIGS. 1 and 2, wherein identical reference signs in the figures indicate identical component parts with an identical function.

In the drawings:

FIG. 2: shows the system from FIG. 1 as a block diagram with a removable battery pack and an electrical device designed as a charging device.

DETAILED DESCRIPTION

Figure 1:
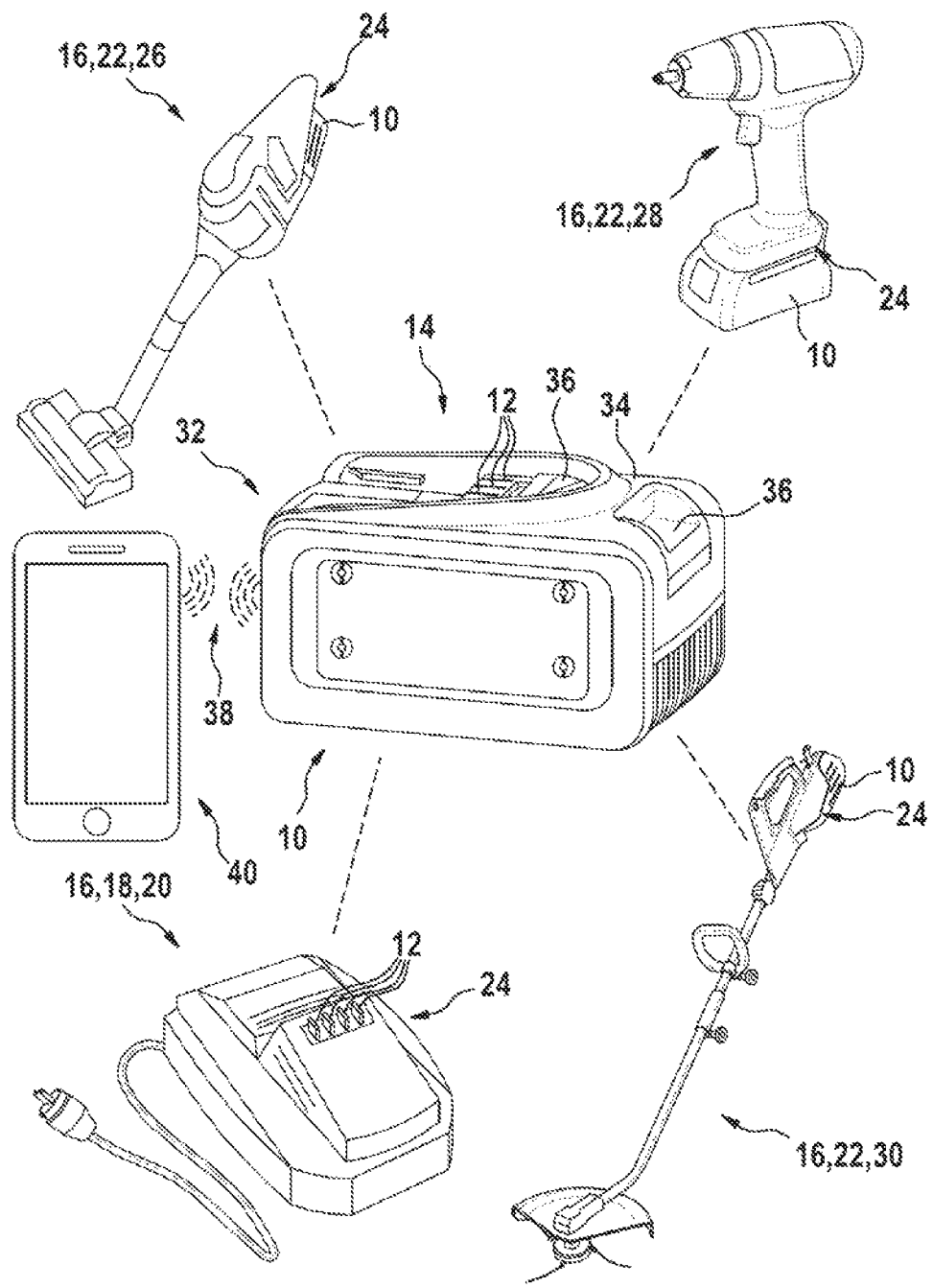
FIG. 1: shows a schematic illustration of a system comprising at least one removable battery pack and at least one electrical device that can be connected to the removable battery pack for charging or discharging the removable battery pack

FIG. 1 shows a system comprising a removable battery pack 10 having a first electromechanical interface 14 having a plurality of electrical contacts 12 and an electrical device 16, in particular a charging device 18, a diagnostic device 20 or an electrical consumer 22, having a further electromechanical interface 24 having a plurality of electrical contacts 12. FIG. 1 is intended to illustrate that the system according to the disclosure is suitable for various electrical devices 16 operated using removable battery packs 10 without restricting the disclosure. In this case, a cordless vacuum cleaner 26, a cordless impact wrench 28 and a cordless lawn trimmer 30 are shown by way of example. In the context of the disclosure, however, a wide variety of power tools, gardening appliances and domestic appliances can be considered as electrical consumers. The number of removable battery packs 10 within the system can also be changed. The system can indeed also comprise several removable battery packs 10. It should furthermore be noted that, although in FIG. 1 the charging device 18 and the diagnostic device 20 are illustrated as one and the same electric device 16 because a charging device 18 can indeed also have a diagnostic function, it is conceivable, without restricting the disclosure, that the diagnostic device 20 does not have a charging function but serves only for pure diagnostics of the removable battery pack 10 for electrical fault states.

It should be noted that the configuration of the electromechanical interfaces of the removable battery packs and the electrical devices that can be connected thereto and also the associated receptacles for force-fitting and/or form-fitting releasable connection are not intended to be the subject of this disclosure. A person skilled in the art will select a suitable embodiment for the interface depending on the power or voltage class of the electrical device and/or the removable battery pack. The embodiments shown in the drawings are therefore to be understood as purely exemplary. It is thus possible, in particular, to also use interfaces having more than the illustrated electrical contacts.

The removable battery pack 10 is essentially a conventional removable battery pack having a housing 32, which has on a first side wall or the top side 34 thereof the first electromechanical interface 14 for releasable connection to the electromechanical interface 24 of the electrical device 16. In connection with the electrical consumer 22, the first and the further electromechanical interface 14, 24 primarily serve to discharge the removable battery pack 10 while, in connection with the charging device 18, it serves to charge and, in connection with the diagnostic device 20, it serves for fault diagnosis of the removable battery pack 10. The precise configuration of the first and the further electromechanical interface 14, 24 is dependent on different factors, such as the voltage class of the removable battery pack 10 or the electrical device 16 and various manufacturer specifications, for example, It is thus possible to provide, for example, three or more electrical contacts 12 for energy and/or data transmission between the removable battery pack 10 and the electrical device 16. Mechanical coding is also conceivable, such that the removable battery pack 10 can be operated only at specific electrical devices 16. Since the mechanical configuration of the first electromechanical interface 14 of the removable battery pack and the further electromechanical interface 24 of the electrical device 16 is insignificant for the disclosure, this will not be dealt with in more detail here. Both the person skilled in the art and an operator of the removable battery pack 14 and the electrical device 16 will make the suitable selection in this regard.

The removable battery pack 10 has a mechanical arresting apparatus 36 for arresting the form-fitting and/or force-fitting detachable connection of the first electromechanical interface 14 of the removable battery pack 10 at the corresponding mating interface 24 (not shown in detail) of the electrical consumer 22. In this case, the arresting apparatus 36 is designed as a sprung pushbutton, which is operatively connected to an arresting member of the removable battery pack 10. Due to the suspension of the pushbutton 38 and/or the arresting member, the arresting apparatus 36 latches into the mating interface 24 of the electrical consumer 22 when the removable battery pack 10 is inserted. If an operator presses the pushbutton in the insertion direction, the arresting system is released and the operator can remove or eject the removable battery pack 10 from the electrical consumer 22 counter to the insertion direction.

As already mentioned at the beginning, the battery voltage of the removable battery pack 10 usually results from a multiple of the individual voltages of the energy storage cells (not shown) depending on the interconnection (in parallel or in series). The energy storage cells are preferably designed as lithium-based battery cells, for example Li-ion, Li—Po, Li-metal and the like. However, the disclosure can also be applied to removable battery packs with Ni—Cd, Ni-MH cells or other suitable cell types.

It is possible for the user to transmit information about the charging and/or discharging processes of the removable battery pack 10 to an external device 40, such as a smartphone, tablet, PC, a cloud or the like, for example, via a communication interface 38 of the removable battery pack 10, said communication interface preferably being designed as a radio interface (for example Bluetooth, WLAN, NFC, Zigbee, LoRa, GSM, UMTS or the like). In particular, information about the identified measures not provided for by the manufacturer on or using the removable battery pack can also be transmitted to the external device 40 via same. As an alternative or in addition, the communication interface 38 can also be designed to be wired (for example USB, Lightning, RS232 or the like).

In FIG. 2, the system from FIG. 1 is illustrated in a block diagram with the removable battery pack 10 on the left-hand side and the electrical device 16 designed as a charging device 18 on the right-hand side. The removable battery pack 10 and the charging device 18 have the mutually corresponding electromechanical interfaces 14 and 24 having a plurality of electrical contacts 12, wherein in each case a first of the electrical contacts 12 of the interfaces 14, 24 serves as an energy supply contact 42 that can be supplied with a first reference potential $V_1$, preferably a supply potential $V_+$, and in each case a second of the electrical contacts 12 of the interfaces 14, 24 serves as an energy supply contact 44 that can be supplied with a second reference potential $V_2$, preferably a ground potential GND. On the one hand, the removable battery pack 10 can be charged by the charging device 18 via the first and the second energy supply contact 42, 44. On the other hand, discharge of the removable battery pack 10 is also effected via the same for the case that the electrical device 16 is designed as an electrical consumer 22. The term "can be supplied with" is intended to illustrate that the potentials $V_+$ and GND, in particular in the case of an electrical device 16 designed as an electrical consumer 22, are not permanently applied to the energy supply contacts 42, 44 but only after connection of the electrical interface 14, 24. The same applies for a discharged removable battery pack 10 after connection to the charging device 18.

The removable battery pack 10 has a plurality of energy storage cells 46, which, although they are illustrated in FIG. 2 as a series circuit, they can alternatively or additionally also be operated in a parallel circuit, wherein the series circuit defines the voltage $U_{Batt}$ of the removable battery pack dropped across the energy supply contacts 42, 44, whereas a parallel circuit of individual energy storage cells 46 primarily increases the capacity of the removable battery pack 10. As already mentioned, individual cell clusters consisting of parallel-interconnected energy storage cells 46 can also be connected in series in order to achieve a specific voltage $U_{Batt}$ of the removable battery pack at the same time as an increased capacity. In current Li-ion energy storage cells 46 with a cell voltage $U_{Cell}$ of in each case 3.6 V, in the present exemplary embodiment a removable battery pack voltage $U_{Batt}=V_1-V_2$ of 5·3.6 V=18 V drops across the energy supply contacts 42, 44. Depending on the number of energy storage cells 46 connected in parallel in a cell cluster, the capacity of current removable battery packs 10 can be up to 12 Ah or more. However, the disclosure is not dependent on the type, design, voltage, current-carrying ability, etc. of the energy storage cells 46 used, but instead can be applied to any removable battery packs 10 and energy storage cells 46.

To monitor the individual series-connected energy storage cells 46 or cell clusters of the removable battery pack 10, an SCM (single cell monitoring) preliminary stage 48 is provided. The SCM preliminary stage 48 has a multiplexer measuring apparatus 50, which can be connected in a high-impedance manner to corresponding taps 54 of the poles of the energy storage cells 46 or cell clusters via filter resistors 52. To detect the individual cell voltages $U_{Cell}$, the multiplexer measuring apparatus 50 switches over sequentially between the individual tabs 54, for example by means of integrated transistors, which are not shown in more detail, in such a way that it is connected in each case to a positive and a negative pole of the energy storage cell 46 to be measured or the cell cluster to be measured. In the following text, the term energy storage cell is also intended to include the cell cluster, since these only influence the capacity of the removable battery pack 10, but are synonymous for detecting the cell voltages $U_{Cell}$. The filter resistors 52, which are configured, in particular, in a high-impedance manner, can prevent dangerous heating of the measuring inputs of the multiplexer measuring apparatus 50, in particular in the event of a fault.

The switchover of the multiplexer measuring apparatus 50 is effected by means of a first monitoring unit 56 integrated in the removable battery pack 10. Said monitoring unit can additionally close or open switching elements 58 of the SCM preliminary stage 48 that are connected in parallel with the energy storage cells 46 in order to effect what is known as balancing of the energy storage cells 46 to achieve uniform charging and discharging states of the individual energy storage cells 46. It is likewise conceivable that the SCM preliminary stage 48 passes the measured cell voltages $U_{Cell}$ directly through to the first monitoring unit 56 such that the actual measurement of the cell voltages $U_{Cell}$ is carried out directly by the first monitoring unit 56, for example by means of an appropriate analog-to-digital converter (ADC).

The first monitoring unit 56 can be designed as an integrated circuit in the form of a microprocessor, ASIC, DSP or the like. However, it is likewise conceivable that the monitoring unit 56 consists of a plurality of microprocessors or at least partly of discrete components with appropriate transistor logic. In addition, the first monitoring unit 56 can have a memory for storing operating parameters of the removable battery pack 10, such as, for example, the voltage $U_{Batt}$, the cell voltages $U_{Cell}$, a temperature T, a charging or discharge current I or the like.

In addition to the first monitoring unit 56 in the removable battery pack 10, the electrical device 16 of the system has a further monitoring unit 60, which can be designed correspondingly to the first monitoring unit 56. The first and the further monitoring unit 56 and 60, respectively, can exchange information, preferably digitally, via a third contact 12, designed as a signal or data contact 62, of the two electromechanical interfaces 14, 24.

The further monitoring unit 60 of the electrical device 16 designed as a charging device 18 controls a power output stage 64, which is connected to the first and the second energy supply contact 42, 44 of the further interface 24 and by means of which the removable battery pack 10 plugged into the charging device 18 can be charged using the charging current I and the voltage $U_{Batt}$ corresponding to the removable battery pack 10. For this purpose, the charging device 18 or the power output stage 64 is provided with a mains connection, which is not shown. The voltage $U_{Batt}$ applied to the energy supply contacts 42, 44 can be measured by means of a voltage measuring apparatus 66 in the charging device 18 and evaluated by the further monitoring unit 60. The voltage measuring apparatus 66 can also be integrated fully or partly in the monitoring unit 60, for example in the form of an integrated ADC.

A temperature T of the removable battery pack 10 or the energy storage cells 46 can be measured by means of a temperature sensor 68, which is arranged in the removable battery pack 10 and preferably designed as an NTC and in close thermal contact with at least one of the energy storage cells 46, and evaluated by the further monitoring unit 60 of the charging device 18. To this end, the temperature sensor 68 is connected on one side to the second reference potential $V_2$, in particular to the ground potential GND, which is applied to the second energy supply contact 44 via a switching element 70, for example a bipolar transistor or MOSFET, which is integrated in the removable battery pack 10, and on the other side to a contact 12, designed as a signal or data contact 72, of the first interface 14 of the removable battery pack 10. A signal or data contact 72 is accordingly provided in the further interface 24 of the charging device 18, said contact being connected to the further monitoring unit 60. Furthermore, a connection, which is not shown, can also exist between the signal or data contact 72 of the first interface 14 of the removable battery pack 10 and the first monitoring unit 56 of the removable battery pack 10. Via said connection, the first monitoring unit 56 could determine whether the temperature T measured by the temperature sensor 68 has been requested by the further monitoring unit 60 of the charging device 18. If this were the case, the first monitoring unit 56 could be transferred automatically from a quiescent mode to an operating mode. If there had been no such request, the quiescent mode could allow the first monitoring unit 56 significantly longer idle and storage times of the removable battery pack 10 due to the reduced quiescent current.

In order that the charging device 18 can identify the removable battery pack 10 and, if necessary, enable it for charging, the removable battery pack 10 has a first coding resistor 74, which is connected on one side to the second reference potential $V_2$, in particular to the ground potential GND, which is applied to the second energy supply contact 44 and on the other side to the third contact 12, designed as a signal or data contact 62, of the first interface 14 of the removable battery pack 10. If the resistance value of the first coding resistor 74 corresponds to a value stored in the further monitoring unit 56 of the charging device 60, the charging device 18 enables the charging process and charges the removable battery pack 10 according to the charging parameters stored in a look-up table, in particular the charging current I, the charging voltage $U_{Batt}$, the permissible temperature range, etc. In addition to the first coding resistor 74, a second coding resistor 76 is provided in the removable battery pack 10, said second coding resistor being connected, in a manner corresponding to the first coding resistor 74, to the second reference potential $V_2$ and a further contact 12, designed as a signal or data contact 78, of the first interface 14 of the removable battery pack 10. An electrical device 16 designed as an electrical consumer 22 can enable the discharge process of the removable battery pack 10 by means of the second coding resistor 76. To this end, analogously to the charging device 18, the electrical consumer 22 has a further monitoring unit 60, which requests the resistance value of the second coding resistor 76 by means of a contact 12, designed as a signal or data contact 78, of the further interface 24 and compares it with a stored value. If the values do not correspond, the discharging process of the removable battery pack 10 is terminated or not permitted, with the result that the electrical consumer 22 cannot be set into operation. When they correspond, an operator can set the electrical consumer 22 into operation. This advantageously allows operation of removable battery packs 10 of different power classes with identical electromechanical interfaces 14 or 24. It is self-evident that, in the case of an electrical consumer 22, the power output stage 64 contained in the charging device 18 is designed as a drive unit, for example as an electric motor (possibly with power output stage accordingly connected upstream) or another unit that consumes energy. The configuration of such a unit will not be dealt with further here since it is well known to a person skilled in the art for a wide variety of types of electrical consumers 22 and also does not have any critical importance for the disclosure.

The voltage $U_{Batt}$ of the removable battery pack 10 and/or the cell voltage $U_{Cell}$ of the at least one energy storage cell 46 is detected and stored by the first monitoring unit 56 of the removable battery pack 10 before the first monitoring unit 56 is set to a quiescent state or while the removable battery pack 10 is in a state other than a charging operating state. The voltage $U_{Batt}$ and/or the cell voltage $U_{Cell}$ is detected again and compared with the previously stored voltage $U_{Batt}$ or cell voltage $U_{Cell}$ by the first monitoring unit 56 when the first monitoring unit 56 is then set to an operating state or while the removable battery pack 10 is in a state other than a charging operating state.

Operating states other than the charging operating state can be understood, in particular, as a discharging operating state, an operating state in which only the current state of charge of the removable battery pack 10 and/or identified fault states are displayed, or a cyclical alert state for checking the removable battery pack 10 and/or for activating the communication interface 38.

By means of the coding resistors 74, 76, the first monitoring unit 56 of the removable battery pack 10 can determine whether the removable battery pack 10 is being used in a charging device 18 or an electrical consumer 22 by virtue of in each case the voltage at the corresponding contacts 12, designed as signal or data contact 78 or 62, of the interfaces 14, 24 being requested after the first monitoring unit 56 of the removable battery pack 10 has been set from the quiescent state to an operating state based on a signal at the contact 12, designed as signal or data contact 72, of the interfaces 14, 24.

A non-volatile memory of the first monitoring unit 56 or the removable battery pack 10 is used to store the detected voltage $U_{Batt}$ and/or cell voltage $U_{Cell}$. In this case, the voltage $U_{Batt}$ and/or cell voltage $U_{Cell}$ is stored in the non-volatile memory when the first monitoring unit 56 is set to a quiescent state. When the monitoring unit 56 is set to an operating state or while the removable battery pack 10 is in a state other than a charging operating state, the voltage $U_{Batt}$ and/or the cell voltage $U_{Cell}$ can in contrast be stored in a non-volatile or volatile manner. A non-volatile memory is intended to be understood as a memory that permanently retains its data even without an applied supply voltage, while this is generally not the case with a volatile memory. Examples of non-volatile memories are EEPROM (electrically erasable programmable read-only memory), FRAM (ferroelectric random-access memory), MRAM (magnetoresistive random-access memory) or phase-change RAM. Known volatile memories are, in particular, DRAM (dynamic random-access memory) or SRAM (static random-access memory). However, this list is purely exemplary and is not to be understood as restrictive.

When the detected voltage $U_{Batt}$ and/or cell voltage $U_{Cell}$ is greater than the previously stored voltage $U_{Batt}$ or cell voltage $U_{Cell}$ by more than a permissible difference value $U_{Diff}$, in particular by more than 500 mV, the first monitoring unit 56 of the removable battery pack 10 identifies that a measure that is not provided for by the manufacturer has been carried out. In this case, a measure that is not provided for by the manufacturer is intended to be understood, for example, as charging using a charging device 18 that is extraneous to the system and that has not been provided for or enabled for the charging process by the manufacturer of the removable battery pack 10. The manipulation to the removable battery pack 10 by exchanging individual or several defective energy storage cells 46 likewise constitutes a measure that is not provided for by the manufacturer that can be identified according to the disclosure.

In short, if the removable battery pack 10 falls asleep, the first monitoring unit 56 stores the detected voltage $U_{Batt}$ of the removable battery pack 10 and/or the detected cell voltage $U_{Cell}$ of the at least one energy storage cell 46. As soon as the removable battery pack 10 wakes up again, the first monitoring unit 56 compares the currently detected voltage $U_{Batt}$ or cell voltage $U_{Cell}$ with the previously stored voltage $U_{Batt}$ or cell voltage $U_{Cell}$. If, for example, the currently detected voltage $U_{Batt}$ or cell voltage $U_{Cell}$ is then greater than the voltage $U_{Batt}$ or cell voltage $U_{Cell}$ stored before the falling asleep by more than the permissible difference value $U_{Diff}$, it is very likely that since its last use either the removable battery pack 10 has been charged using a charging device that does not belong to the system or that at least one energy storage cell 46 has been exchanged.

If the removable battery pack 10 wakes up and is not charged as intended, the voltage $U_{Batt}$ or the cell voltage $U_{Cell}$ is continuously detected, stored and in each case compared with the previously stored values by the first monitoring unit 56. In this case, the voltage difference determined may increase by not more than the permissible difference value $U_{Diff}$. For example in the case of an intended use of the removable battery pack 10 in an electrical consumer 22, it can be expected that the voltage $U_{Batt}$ and the cell voltage $U_{Cell}$ decrease. If, however, the first monitoring unit 56 of the removable battery pack 10 identifies a voltage increase in the electrical consumer 22, it can be assumed that in the meantime an unintended charging process has taken place and/or that the removable battery pack 10 is not functioning correctly.

Provision can further be made for the first monitoring unit 56 to detect the temperature T of the removable battery pack 10 and/or the at least one energy storage cell 46 at the time of the voltage detection in order to adapt the permissible difference value $U_{Diff}$ to the detected temperature T. Temperature fluctuations that influence the cell voltage $U_{Cell}$ can be compensated for in this way.

If a measure that is not provided for by the manufacturer has been identified by the first monitoring unit 56 of the removable battery pack 10, said monitoring unit refuses the intended use in the system in future by virtue of it deactivating the temperature sensor 68 by means of the switching element 70. In this way, the charging device 18 and/or the electrical consumer 22 of the system detect a blocking of the removable battery pack 10 for a charging or discharging process and react thereto with corresponding measures of its further monitoring units 60. As an alternative, it is conceivable that the removable battery pack 10 is not blocked but only restricted in terms of its use. It is thus possible, for example, to reduce the voltage $U_{Batt}$ or the discharge current I by deactivating individual energy storage cells 46.

In addition, provision can be made for the blocking or restriction of a discharging process in connection with an electrical consumer 22 of the system to be canceled again by the monitoring unit 56 of the removable battery pack 10 after an intended and fault-free charging process has been carried out using a charging device 18 of the system.

The identified measures that are not provided for by the manufacturer can be stored in a non-volatile manner and/or transmitted via the communication interface 38 to the external device 40 by the first monitoring unit 56 of the removable battery pack 10. Therefore, a misuse of the removable battery pack 10 can be identified at the manufacturer and an appropriate reaction thereto can be taken with respect to a possible warranty and/or product liability, for example by virtue of a misused removable battery pack 10 being withdrawn from circulation by the manufacturer.

To signal an identified measure that is not provided for by the manufacturer, the electrical device 16 and/or the removable battery pack 10 have a corresponding display, which is not shown in more detail, in the form of LEDs, a display screen and/or an acoustic signal generator. In addition or as an alternative, the display can also be designed as a haptic signal generator, for example in the form of a vibration motor. In the case of an electrical consumer 22 driven by electric motor, it is also conceivable that a drive motor for an insert tool serves as haptic and/or acoustic signal generator.

Finally, it should be pointed out that the exemplary embodiments shown are not restricted either to FIGS. 1 and 2 nor to the number and type of removable battery packs 10 and electrical devices 16 shown therein. The same applies to the number of energy storage cells 46. The configurations of the interfaces 14, 24 and the number of contacts 12 thereof shown should be understood as purely exemplary.

What is claimed is:

1. A method for identifying a misuse of a removable battery pack having at least one energy storage cell and a monitoring unit, the method comprising:
    detecting and storing a first voltage of the removable battery pack and/or a first cell voltage of the at least one energy storage cell using the monitoring unit before the monitoring unit is set to a quiescent state;
    detecting a second voltage of the removable battery pack and/or a second cell voltage using the monitoring unit when the monitoring unit changes from the quiescent state to an operating state;
    detecting a temperature of the removable battery pack and/or a temperature of the at least one energy storage cell using a temperature sensor at a time of the first voltage detection and/or the first cell voltage detection, the temperature sensor operably connected to the monitoring unit;
    comparing the first voltage with the second voltage when the second first voltage has been detected;
    comparing the first cell voltage with the second cell voltage when the second first cell voltage has been detected;
    adapting a first permissible difference value based on the detected temperature of the removable battery pack, using the monitoring unit;
    adapting a second permissible difference value based on the detected temperature of the at least one energy storage cell, using the monitoring unit;
    determining a misuse of the removable battery pack when (i) the second voltage is greater than the first voltage by more than the adapted first permissible difference value, and/or (ii) the second cell voltage is greater than the first cell voltage by more than the adapted second permissible difference value; and
    preventing use of the removable battery pack when the misuse is determined.

2. The method according to claim 1, wherein:
    the detected first voltage of the removable battery pack and/or the detected first cell voltage is stored in a non-volatile manner when the monitoring unit is set to the quiescent state; and
    the detected second voltage of the removable battery pack and/or the detected second cell voltage is stored in the non-volatile manner or a volatile manner when the monitoring unit is set to the operating state.

3. The method according to claim 1, wherein preventing use of the removable battery pack when the misuse is determined comprises:
    blocking or restricting the removable battery pack for an intended charging and/or discharging process, using the monitoring unit.

4. The method according to claim 3, further comprising:
    displaying the blocking or the restriction of the removable battery pack on a display of the removable battery pack.

5. The method according to claim 3, wherein:
    the blocking or the restriction is cancelled by the monitoring unit after charging the removable battery pack according to a charging process provided for by a manufacturer of the removable battery pack.

6. The method according to claim 3, further comprising:
    identifying the blocking or the restriction of the removable battery pack using a haptic signal generator of the removable battery pack.

7. The method according to claim 1, wherein the determined misuse is stored and/or transmitted to an external device using the monitoring unit.

8. The method according to claim 1, wherein the determined misuse results from charging the removable battery pack using a charging device that has not been provided for or enabled by the manufacturer of the removable battery pack.

9. The method according to claim 1, wherein the determined misuse results from exchanging the at least one energy storage cell with at least one different energy storage cell.

10. The method according to claim 1, wherein:
    the quiescent state is a sleep state of the removable battery pack, and
    the operating state is a wake state of the removable battery pack.

11. A removable battery pack, comprising:
    at least one energy storage cell;
    a temperature sensor configured to detect a temperature of the at least one energy storage cell; and
    a monitoring unit operably connected to the at least one energy storage cell and the temperature sensor, the monitoring unit configured to identify a misuse of the at least one energy storage cell, the monitoring unit configured to:
        detect and store a first cell voltage of the at least one energy storage cell before the monitoring unit is set to a quiescent state;
        detect a second cell voltage of the at least one energy storage cell when the monitoring unit changes from the quiescent state to an operating state;
        detect the temperature of the at least one energy storage cell using the temperature sensor at a time of the first cell voltage detection;
        compare the first cell voltage with the second cell voltage when the second cell voltage has been detected;

adapt a permissible difference value based on the detected temperature of the at least one energy storage cell;

determine a misuse of the removable battery pack when the second cell voltage is greater than the first cell voltage by more than the adapted permissible difference value; and prevent use of the at least one energy storage cell when the misuse is determined.

12. The removable battery pack according to claim 11, further comprising:

a non-volatile memory configured to store the first cell voltage and the second cell voltage.

13. The removable battery pack according to claim 11, further comprising:

a switching element operably connected to the temperature sensor and the monitoring unit, wherein the monitoring unit is further configured to:

deactivate the temperature sensor using the switching element when the monitoring unit has identified the misuse.

14. The removable battery pack according to claim 11, wherein the permissible difference value is more than 500 mV.

* * * * *